United States Patent
Doy et al.

(10) Patent No.: US 10,832,537 B2
(45) Date of Patent: Nov. 10, 2020

(54) METHODS AND APPARATUS FOR OUTPUTTING A HAPTIC SIGNAL TO A HAPTIC TRANSDUCER

(71) Applicant: Cirrus Logic International Semiconductor Ltd., Edinburgh (GB)

(72) Inventors: Anthony S. Doy, Los Gatos, CA (US); Nermin Osmanovic, Austin, TX (US); Carl L. Ståhl, Malmö (SE)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/289,080

(22) Filed: Feb. 28, 2019

(65) Prior Publication Data
US 2019/0311590 A1    Oct. 10, 2019

Related U.S. Application Data

(60) Provisional application No. 62/652,639, filed on Apr. 4, 2018.

(51) Int. Cl.
*H04B 3/36* (2006.01)
*G08B 6/00* (2006.01)
*H04R 3/00* (2006.01)

(52) U.S. Cl.
CPC .................. *G08B 6/00* (2013.01); *H04R 3/00* (2013.01); *H04R 2400/03* (2013.01)

(58) Field of Classification Search
CPC ......... G08B 6/00; H04R 3/00; H04R 2400/03
See application file for complete search history.

(56) References Cited

U.S. PATENT DOCUMENTS

| | | | |
|---|---|---|---|
| 4,902,136 A | 2/1990 | Mueller et al. |
| 5,684,722 A | 11/1997 | Thorner et al. |
| 5,748,578 A | 5/1998 | Schell |
| 5,857,986 A | 1/1999 | Moriyasu |
| 6,050,393 A | 4/2000 | Murai et al. |
| 6,278,790 B1 | 8/2001 | Davis et al. |
| 6,332,029 B1 | 12/2001 | Azima et al. |
| 6,388,520 B2 | 5/2002 | Wada et al. |

(Continued)

FOREIGN PATENT DOCUMENTS

| | | |
|---|---|---|
| AU | 2002347829 | 4/2003 |
| CN | 103165328 A | 6/2013 |

(Continued)

OTHER PUBLICATIONS

International Search Report and Written Opinion of the International Searching Authority, International Application No. PCT/GB2019/050964, dated Sep. 3, 2019.

(Continued)

*Primary Examiner* — Quang Pham
(74) *Attorney, Agent, or Firm* — Jackson Walker L.L.P.

(57) ABSTRACT

Embodiments described herein relate to methods and apparatus for outputting a haptic signal to a haptic transducer. A method for triggering a haptic signal being output to a haptic transducer comprises receiving an audio signal for output through an audio output transducer; determining whether the audio signal comprises a haptic trigger based on an indication of a rate of change of an amplitude of the audio signal, and responsive to determining that the audio signal comprises a haptic trigger, triggering the haptic signal to be output to the haptic transducer.

9 Claims, 9 Drawing Sheets

(56) References Cited

U.S. PATENT DOCUMENTS

| | | |
|---|---|---|
| 6,580,796 B1 | 6/2003 | Kuroki |
| 6,683,437 B2 | 1/2004 | Tierling |
| 6,703,550 B2 | 3/2004 | Chu |
| 6,762,745 B1 | 7/2004 | Braun et al. |
| 6,906,697 B2 | 6/2005 | Rosenberg |
| 6,995,747 B2 | 2/2006 | Casebolt et al. |
| 7,154,470 B2 | 12/2006 | Tierling |
| 7,623,114 B2 | 11/2009 | Rank |
| 7,639,232 B2 | 12/2009 | Grant et al. |
| 7,791,588 B2 | 9/2010 | Tierling et al. |
| 7,979,146 B2 | 7/2011 | Ullrich et al. |
| 8,068,025 B2 | 11/2011 | Devenyi et al. |
| 8,098,234 B2 | 1/2012 | Lacroix et al. |
| 8,102,364 B2 | 1/2012 | Tierling |
| 8,325,144 B1 | 12/2012 | Tierling et al. |
| 8,427,286 B2 | 4/2013 | Grant et al. |
| 8,466,778 B2 | 6/2013 | Hwang et al. |
| 8,480,240 B2 | 7/2013 | Kashiyama |
| 8,572,293 B2 | 10/2013 | Cruz-Hernandez et al. |
| 8,593,269 B2 | 11/2013 | Grant et al. |
| 8,648,829 B2 | 2/2014 | Shahoian et al. |
| 8,659,208 B1 | 2/2014 | Rose et al. |
| 8,947,216 B2 | 2/2015 | Da Costa et al. |
| 8,981,915 B2 | 3/2015 | Birnbaum et al. |
| 8,994,518 B2 | 3/2015 | Gregorio et al. |
| 9,030,428 B2 | 5/2015 | Fleming |
| 9,063,570 B2 | 6/2015 | Weddle et al. |
| 9,083,821 B2 | 7/2015 | Hughes |
| 9,092,059 B2 | 7/2015 | Bhatia |
| 9,117,347 B2 | 8/2015 | Matthews |
| 9,128,523 B2 | 9/2015 | Buuck et al. |
| 9,164,587 B2 | 10/2015 | Da Costa et al. |
| 9,196,135 B2 | 11/2015 | Shah et al. |
| 9,248,840 B2 | 2/2016 | Truong |
| 9,329,721 B1 | 5/2016 | Buuck et al. |
| 9,354,704 B2 | 5/2016 | Lacroix et al. |
| 9,368,005 B2 | 6/2016 | Cruz-Hernandez et al. |
| 9,489,047 B2 | 11/2016 | Jiang et al. |
| 9,507,423 B2 | 11/2016 | Gandhi et al. |
| 9,513,709 B2 | 12/2016 | Gregorio et al. |
| 9,520,036 B1 | 12/2016 | Buuck et al. |
| 9,588,586 B2 | 3/2017 | Rihn |
| 9,640,047 B2 | 5/2017 | Choi et al. |
| 9,652,041 B2 | 5/2017 | Jiang et al. |
| 9,697,450 B1 | 7/2017 | Lee |
| 9,740,381 B1 * | 8/2017 | Chaudhri .............. G06F 3/0485 |
| 9,842,476 B2 | 12/2017 | Rihn et al. |
| 9,864,567 B2 | 1/2018 | Seo |
| 9,881,467 B2 | 1/2018 | Levesque |
| 9,946,348 B2 | 4/2018 | Ullrich et al. |
| 9,959,744 B2 | 5/2018 | Koskan et al. |
| 10,032,550 B1 | 7/2018 | Zhang et al. |
| 10,055,950 B2 | 8/2018 | Saboune et al. |
| 10,074,246 B2 | 9/2018 | Da Costa et al. |
| 10,110,152 B1 | 10/2018 | Hajati |
| 10,175,763 B2 | 1/2019 | Shah |
| 10,620,704 B2 | 4/2020 | Rand et al. |
| 2002/0018578 A1 | 2/2002 | Burton |
| 2003/0068053 A1 * | 4/2003 | Chu ........................ H04R 5/02 381/118 |
| 2003/0214485 A1 | 11/2003 | Roberts |
| 2006/0028095 A1 | 2/2006 | Maruyama et al. |
| 2006/0284856 A1 | 12/2006 | Soss |
| 2008/0167832 A1 | 7/2008 | Soss |
| 2008/0293453 A1 | 11/2008 | Atlas et al. |
| 2008/0316181 A1 | 12/2008 | Nurmi |
| 2009/0079690 A1 | 3/2009 | Watson et al. |
| 2009/0088220 A1 | 4/2009 | Persson |
| 2009/0102805 A1 | 4/2009 | Meijer et al. |
| 2009/0153499 A1 | 6/2009 | Kim et al. |
| 2010/0141408 A1 | 6/2010 | Doy et al. |
| 2010/0141606 A1 | 6/2010 | Bae et al. |
| 2011/0141052 A1 | 6/2011 | Bernstein et al. |
| 2011/0167391 A1 | 7/2011 | Momeyer et al. |
| 2012/0105358 A1 | 5/2012 | Momeyer et al. |
| 2012/0206246 A1 | 8/2012 | Cruz-Hernandez et al. |
| 2012/0206247 A1 | 8/2012 | Bhatia et al. |
| 2012/0229264 A1 | 9/2012 | Company Bosch et al. |
| 2012/0306631 A1 * | 12/2012 | Hughes ............... G09B 21/009 340/407.1 |
| 2013/0027359 A1 | 1/2013 | Schevin et al. |
| 2013/0141382 A1 | 6/2013 | Simmons et al. |
| 2013/0275058 A1 | 10/2013 | Awad |
| 2013/0289994 A1 | 10/2013 | Newman et al. |
| 2014/0056461 A1 | 2/2014 | Afshar |
| 2014/0064516 A1 | 3/2014 | Cruz-Hernandez et al. |
| 2014/0079248 A1 * | 3/2014 | Short ..................... G10L 13/02 381/119 |
| 2014/0085064 A1 | 3/2014 | Crawley et al. |
| 2014/0292501 A1 | 10/2014 | Lim et al. |
| 2014/0340209 A1 | 11/2014 | Lacroix et al. |
| 2015/0070260 A1 | 3/2015 | Saboune et al. |
| 2015/0084752 A1 * | 3/2015 | Heubel .................. G06F 3/011 340/407.1 |
| 2015/0216762 A1 | 8/2015 | Oohashi et al. |
| 2015/0324116 A1 * | 11/2015 | Marsden ............. G06F 3/0231 345/158 |
| 2015/0325116 A1 | 11/2015 | Umminger, III |
| 2015/0341714 A1 | 11/2015 | Ahn et al. |
| 2016/0074278 A1 | 3/2016 | Muench et al. |
| 2016/0132118 A1 | 5/2016 | Park et al. |
| 2016/0162031 A1 | 6/2016 | Westerman et al. |
| 2016/0179203 A1 * | 6/2016 | Modarres ................ G08B 6/00 340/407.1 |
| 2016/0239089 A1 | 8/2016 | Taninaka et al. |
| 2016/0246378 A1 | 8/2016 | Sampanes et al. |
| 2016/0358605 A1 | 12/2016 | Ganong, III et al. |
| 2017/0078804 A1 | 3/2017 | Guo et al. |
| 2017/0153760 A1 | 6/2017 | Chawda et al. |
| 2017/0256145 A1 | 9/2017 | Macours et al. |
| 2017/0277350 A1 | 9/2017 | Wang et al. |
| 2018/0059733 A1 | 3/2018 | Gault et al. |
| 2018/0059793 A1 | 3/2018 | Hajati |
| 2018/0082673 A1 | 3/2018 | Tzanetos |
| 2018/0084362 A1 | 3/2018 | Zhang et al. |
| 2018/0151036 A1 | 5/2018 | Cha et al. |
| 2018/0158289 A1 | 6/2018 | Vasilev et al. |
| 2018/0160227 A1 | 6/2018 | Lawrence et al. |
| 2018/0178114 A1 | 6/2018 | Mizuta et al. |
| 2018/0182212 A1 | 6/2018 | Li et al. |
| 2018/0183372 A1 | 6/2018 | Li et al. |
| 2018/0237033 A1 | 8/2018 | Hakeem et al. |
| 2018/0253123 A1 | 9/2018 | Levesque et al. |
| 2018/0294757 A1 | 10/2018 | Feng et al. |
| 2018/0301060 A1 | 10/2018 | Israr et al. |
| 2018/0321748 A1 | 11/2018 | Rao et al. |
| 2018/0329172 A1 | 11/2018 | Tabuchi |
| 2018/0367897 A1 | 12/2018 | Bjork et al. |
| 2019/0227628 A1 | 1/2019 | Rand et al. |
| 2019/0064925 A1 | 2/2019 | Kim et al. |
| 2019/0073078 A1 | 3/2019 | Sheng et al. |
| 2019/0103829 A1 | 4/2019 | Vasudevan et al. |
| 2019/0138098 A1 | 5/2019 | Shah |
| 2019/0206396 A1 | 7/2019 | Chen |
| 2019/0215349 A1 | 7/2019 | Adams et al. |
| 2019/0114496 A1 | 8/2019 | Lesso |
| 2019/0294247 A1 | 9/2019 | Hu et al. |
| 2019/0296674 A1 | 9/2019 | Janko et al. |
| 2019/0297418 A1 | 9/2019 | Stahl |
| 2019/0311590 A1 * | 10/2019 | Doy ........................ G08B 6/00 |
| 2019/0341903 A1 | 11/2019 | Kim |

FOREIGN PATENT DOCUMENTS

| | | | |
|---|---|---|---|
| EP | 0784844 B1 * | 6/2005 | ............. A63F 13/28 |
| EP | 2363785 A1 | 9/2011 | |
| EP | 2600225 A2 | 6/2013 | |
| EP | 2846218 A1 | 3/2015 | |
| EP | 2846329 A1 * | 3/2015 | ............. G06F 3/016 |
| EP | 3379382 A1 | 9/2018 | |
| EP | 2846218 B1 * | 4/2019 | ............. G10L 21/16 |
| IN | 201747044027 | 8/2018 | |
| JP | H02130433 B2 | 5/1990 | |

(56) References Cited

FOREIGN PATENT DOCUMENTS

| | | |
|---|---|---|
| JP | H08149006 A | 6/1996 |
| JP | 6026751 B2 | 11/2016 |
| JP | 6250985 | 12/2017 |
| JP | 6321351 | 5/2018 |
| KR | 20120126446 A | 11/2012 |
| WO | 2013104919 A1 | 7/2013 |
| WO | 2013186845 A1 | 12/2013 |
| WO | 2014018086 A1 | 1/2014 |
| WO | 2014094283 A1 | 6/2014 |
| WO | 2016105496 A1 | 6/2016 |
| WO | 2016164193 A1 | 10/2016 |
| WO | 2018053159 A1 | 3/2018 |
| WO | 2018067613 A1 | 4/2018 |
| WO | 2018125347 A1 | 7/2018 |

OTHER PUBLICATIONS

Communication Relating to the Results of the Partial International Search, and Provisional Opinion Accompanying the Partial Search Result, of the International Searching Authority, International Application No. PCT/US2018/031329, dated Jul. 20, 2018.
Combined Search and Examination Report, UKIPO, Application No. GB1720424.9, dated Jun. 5, 2018.
International Search Report and Written Opinion of the International Searching Authority, International Application No. PCT/US2020/023342, dated Jun. 9, 2020.
International Search Report and Written Opinion of the International Searching Authority, International Application No. PCT/GB2020/050823, dated Jun. 30, 2020.
International Search Report and Written Opinion of the International Searching Authority, International Application No. PCT/US2020/024864, dated Jul. 6, 2020.
International Search Report and Written Opinion of the International Searching Authority, International Application No. PCT/GB2020/051037, dated Jul. 9, 2020.
Communication Relating to the Results of the Partial International Search, and Provisional Opinion Accompanying the Partial Search Result, of the International Searching Authority, International Application No. PCT/GB2020/050822, dated Jul. 9, 2020.
International Search Report and Written Opinion of the International Searching Authority, International Application No. PCT/GB2020/051035, dated Jul. 10, 2020.
International Search Report and Written Opinion of the International Searching Authority, International Application No. PCT/GB2019/052991, dated Mar. 17, 2020, received by Applicant Mar. 19, 2020.

* cited by examiner

METHODS AND APPARATUS FOR OUTPUTTING A HAPTIC SIGNAL TO A HAPTIC TRANSDUCER

TECHNICAL FIELD

Embodiments described herein relate to methods and apparatus for outputting a haptic signal to a haptic transducer based on a received audio signal for output through a speaker.

BACKGROUND

Generating haptic effects on mobile devices and other devices such as smart home devices or user interfaces for vehicles may be desirable for some applications. In some examples, it may be desirable for these haptic effects to be synchronized with specific audio events, in order to enhance the user experience. In some scenarios, for example where the audio source material is predefined within the system, for example a known version of a particular song, a sequence of haptic events that are designed to be output in conjunction with the song, may conceivably be stored and replayed tangentially with the known audio.

However, there may be examples of audio playback which do not have a predictable or predefined nature. For example, in gaming applications, the rendered audio output may comprise a combination of stored elements (for example background music) in conjunction with other sounds that may be dependent on the game play. The exact timing and output of the latter category of sounds may be reliant on the actions of the user within the game. Due to this user control, the output of a stored sequence of haptics events may not be suitable.

SUMMARY

According to some embodiments, there is provided a method for triggering a haptic signal being output to a haptic transducer. The method comprises receiving an audio signal for output through an audio output transducer; determining whether the audio signal comprises a haptic trigger based on an indication of a rate of change of an amplitude of the audio signal, and responsive to determining that the audio signal comprises a haptic trigger, triggering the haptic signal to be output to the haptic transducer.

In some embodiments, the step of determining comprises: generating a first weighted sum representation of the audio signal utilizing a first number of samples of a rectified version of the audio signal; generating a second weighted sum representation of the audio signal utilizing a second number of samples of the rectified version of the audio signal, wherein the second number of samples is more than the first number of samples; and comparing the first weighted sum representation to the second weighted sum representation. This comparison may provide the indication of the rate of change of the amplitude of the audio signal.

In some embodiments, the step of comparing comprises determining that the audio signal comprises a haptic trigger when the first weighted sum representation exceeds the second weighted sum representation. In some embodiments, the step of comparing comprises determining that the audio signal comprises a haptic trigger when the first weighted sum representation exceeds the second weighted sum representation plus a predetermined offset.

In some embodiments, the method further comprises adjusting a first set of weighting coefficients used to generate the first weighted sum representation, and/or adjusting a second set of weighting coefficient used to generate the second weighted sum representation, based on a desired haptic trigger characteristic.

In some embodiments, the method further comprises adjusting the first number of samples and/or the second number of samples based on a desired haptic trigger characteristic.

In some embodiments, the method further comprises determining that the audio signal comprises a haptic trigger based on the rate of change of the amplitude of the audio signal.

According to some embodiments, there is provided a method comprising receiving an audio signal for output through an audio output transducer; determining, based on the audio signal and at least one criteria, a haptic signal for outputting to the haptic transducer; and dynamically adjusting the at least one criteria based on a parameter, wherein the parameter comprises one or more of: information relating to content of media playback for playback in conjunction with the audio signal, information relating to content of the audio signal, information relating to historical haptic events associated with the audio signal, and a battery charge status of the device.

In some embodiments, the method further comprises responsive to the audio signal, meeting a first criteria of the at least one criteria, determining that the audio signal comprises a haptic trigger, and responsive to determining that the audio signal comprises the haptic trigger, outputting the haptic signal to the transducer.

The first criteria may comprise a threshold rate of change of the audio signal.

In some embodiments, the method further comprises determining the haptic signal based on the haptic trigger and on a second criteria of the at least one criteria.

In some embodiments, the method further comprises generating the haptic signal from the haptic trigger based on a third criteria of the at least one criteria.

The third criteria may comprise one or more of: a maximum amplitude, an allowed dynamic range, and an allowed frequency range.

In some embodiments, the step of adjusting comprises adjusting the at least one criteria to reduce a repetition rate of haptic signal events derived from the audio signal responsive to the parameter indicating that a future repetition rate of haptic signal events should be reduced.

In some embodiments, the parameter indicates whether or not the audio signal comprises speech, and the step of adjusting comprises adjusting the at least one criteria to reduce the repetition rate of haptic signal events responsive to the parameter indicating that the audio signal comprises speech.

In some embodiments, the parameter comprises a battery charge status of the device, and the step of adjusting comprises adjusting the at least one criteria to reduce the repetition rate of haptic signal events responsive to the parameter indicating that the battery charge status is below a threshold level.

In some embodiments, the parameter comprises information relating to the content of media playback for playback in conjunction with the audio signal; and the step of adjusting comprises adjusting the at least one criteria to select a haptic signal based on the content of the media playback.

The media playback may comprise video data.

In some embodiments, the parameter comprises information relating to historical haptic events associated with the audio signal; and the step of adjusting comprises adjusting the at least one criteria to optimize expected future output of a repeated haptic event.

According to some embodiments, there is provided a method for generating a haptic signal for output to a haptic transducer. The method comprises receiving an audio signal for output through an audio output transducer; determining whether the audio signal comprises a haptic trigger; responsive to determining that the audio signal comprises the haptic trigger, mapping energy in the haptic trigger at frequencies outside of an intended frequency range to frequencies within the intended frequency range in the haptic signal by under-sampling data in the audio signal comprising the haptic trigger, such that the energy in the haptic trigger at frequencies above the intended frequency range is shifted into frequencies within the intended frequency range to generate the haptic signal.

In some embodiments, the method further comprises adjusting the dynamic range of the haptic trigger to generate the haptic signal.

In some embodiments, the step of mapping further comprises distorting the audio signal energy at frequencies below the intended frequency range in the haptic trigger, such that corresponding harmonic energy is created within the intended frequency range in the haptic signal.

According to some embodiments, there is provided a processor for triggering a haptic signal being output to a haptic transducer. The processor comprises an input configured to receive an audio signal for output through an audio output transducer; a haptic trigger detection block configured to determine whether the audio signal comprises a haptic trigger based on an indication of a rate of change of an amplitude of the audio signal, and a haptic signal generator configured to trigger the haptic signal to be output to the haptic transducer, responsive to the determination that the audio signal comprises a haptic trigger.

According to some embodiments, there is provided a processor, for outputting a first haptic signal to a haptic transducer in a device. The processor comprises an input configured to receive an audio signal for output through an audio output transducer; a haptic signal determination block configured to determine, based on the audio signal and at least one criteria, a haptic signal for outputting to the haptic transducer, wherein the processor is configured to dynamically adjust the at least one criteria based on a parameter, wherein the parameter comprises one or more of: information relating to content of media playback for playback in conjunction with the audio signal, information relating to content of the audio signal, information relating to historical haptic events associated with the audio signal, and a battery charge status of the device.

According to some embodiments, there is provided a processor for generating a haptic signal for output to a haptic transducer. The processor comprises an input configured to receive an audio signal for output through an audio output transducer; a haptic trigger detection block configured to determine whether the audio signal comprises a haptic trigger; and a haptic signal generator configured to: responsive to determining that the audio signal comprises the haptic trigger, mapping energy in the haptic trigger at frequencies outside of an intended frequency range to frequencies within the intended frequency range in the haptic signal by undersampling data in the audio signal comprising the haptic trigger such that the energy in the haptic trigger at frequencies above the intended frequency range is shifted into frequencies within the intended frequency range to generate the haptic signal.

According to some embodiments, there is provided an electronic apparatus comprising a processor configured to trigger a haptic signal being output to a haptic transducer. The processor comprising an input configured to receive an audio signal for output through an audio output transducer; a haptic trigger detection block configured to determine whether the audio signal comprises a haptic trigger based on an indication of a rate of change of an amplitude of the audio signal, and a haptic signal generator configured to trigger the haptic signal to be output to the haptic transducer, responsive to the determination that the audio signal comprises a haptic trigger.

According to some embodiments, there is provided an electronic apparatus comprising a processor configured to output a first haptic signal to a haptic transducer in a device. The processor comprises an input configured to receive an audio signal for output through an audio output transducer; a haptic signal determination block configured to determine, based on the audio signal and at least one criteria, a haptic signal for outputting to the haptic transducer, wherein the processor is configured to dynamically adjust the at least one criteria based on a parameter, wherein the parameter comprises one or more of: information relating to content of media playback for playback in conjunction with the audio signal, information relating to content of the audio signal, information relating to historical haptic events associated with the audio signal, and a battery charge status of the device.

According to some embodiments, there is provided an electronic apparatus comprising a processor configured to generate a haptic signal for output to a haptic transducer. The processor comprises an input configured to receive an audio signal for output through an audio output transducer; a haptic trigger detection block configured to determine whether the audio signal comprises a haptic trigger; and a haptic signal generator configured to responsive to determining that the audio signal comprises the haptic trigger, mapping energy in the haptic trigger at frequencies outside of an intended frequency range to frequencies within the intended frequency range in the haptic signal by undersampling the haptic trigger data, such that the energy in the haptic trigger at frequencies above the intended frequency range is shifted into frequencies within the intended frequency range to generate the haptic signal.

BRIEF DESCRIPTION OF THE DRAWINGS

For a better understanding of the embodiments of the present disclosure, and to show how embodiments of the present disclosure may be put into effect, reference will now be made, by way of example only, to the accompanying drawings, in which.

DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Figure 1:
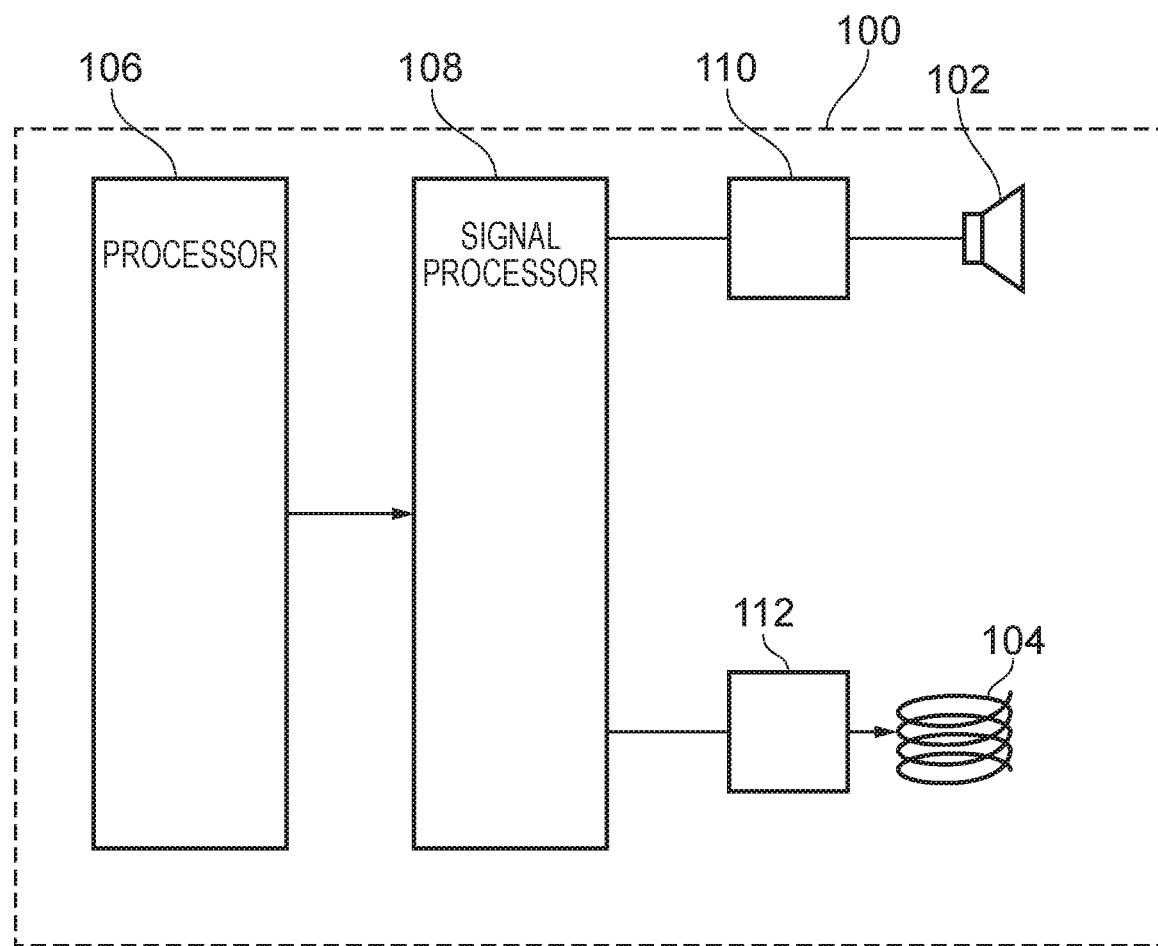
FIG. 1 illustrates an example schematic diagram showing part of a device 100 having audio and haptic output transducers.

FIG. 1 is an example schematic diagram showing part of a device 100 having respective audio and haptic output transducers 102, 104. The device 100 may comprise any electronic apparatus, a portable device; a battery power device; a computing device; a communications device; a gaming device; a mobile telephone; a personal media player; a laptop, tablet or notebook computing device, smart watch, a virtual reality (VR) or augmented reality (AR) device, or a smart home device, for example. For the sake of clarity, elements of the device 100 which are not relevant to the present disclosure are not shown in FIG. 1, but those skilled in the art will appreciate that the device 100 may include further elements and components in addition to those shown in FIG. 1.

The device 100 includes a processor 106, which may be, for example, an application processor. The processor 106 interfaces with a signal processor 108, which may be, for example, a digital signal processor (DSP). The signal processor 108 interfaces with an audio output amplifier 110, which is configured to output an audio signal to drive the audio output transducer 102. The signal processor 108 also interfaces with a haptic output amplifier 112, which is configured to output a haptic signal to drive the haptic transducer 104.

The processor 106 executes and provides an operating environment of the device 100 to allow software applications such as games to be executed by the device 100. Such an application typically receives user inputs. The user inputs may include one or more of the following: touch and/or gestural user inputs that may be detected by a touch-sensitive surface (e.g. a touch screen) of the device (not shown); kinetic user inputs such as rotating or tilting the device that may be detected by a sensor such as an accelerometer or gyroscope of the device (also not shown); and audio user inputs, such as spoken commands that may be detected by a sensor such as a microphone of the device (also not shown). In response to detection of a user input, the application is operative to generate appropriate outputs at the device. For example, the application may be operative to cause images displayed on a display of the device (not shown) to be updated, and to cause appropriate audio effects to be output by the audio output transducer 102. The application may also be operative to cause appropriate haptic outputs to be provided by the haptic output transducer 104 in response to detection of user inputs.

For example, in a driving game application, the user may interact with a touch screen of the device 100, e.g. by touching a graphical representation of an accelerator pedal or a brake pedal presented on a touch screen of the device in order to accelerate or brake a vehicle within the game. Such touches are detected by the touch screen and result in the images displayed on the display of the device being updated by the application to give a visual indication that the vehicle is accelerating or braking. The updates to the images displayed on the display may be accompanied by appropriate audio effects being output by the output audio transducer 102, such as an engine revving effect when the accelerator pedal is touched, or a tire screech effect when the brake pedal is touched.

In order to steer the vehicle, the user may rotate the device in a counter-clockwise direction to turn left or a clockwise direction to turn right. In response to detection of such kinetic inputs by the accelerometer and/or gyroscope of the device, the images displayed on the display are updated as appropriate by the application to give a visual indication of the movement of the vehicle. In addition, appropriate audio effects such as a tire screech effect may be output by the output audio transducer 102.

Audio user input, such as voice commands, may additionally be used, for example to perform special functions such as firing a weapon. On detection of a valid voice command or other audio user input, the images displayed on the display may be updated as appropriate to give a visual indication of the effect of the command, and appropriate audio effects such as a gunshot effect may be output by the output audio transducer 102.

The application may also be configured to make use of the haptic output transducer 104 to provide additional sensory information to the user. In the driving game application example discussed above, in addition to updating the images displayed on the display and outputting appropriate audio effects, the device 100 may also provide haptic outputs in response to the user inputs. For example, the haptic output transducer 104 may be actuated to cause the device 100 to vibrate at the same time as the images displayed on the display are updated and the audio effect is output by the output audio transducer 102, thereby providing additional sensory information to the user.

In such applications, the haptic output may be designed into the application at the outset. In other words, the designer of the application may identify the user inputs, visual outputs, and audio outputs that are to be associated with haptic outputs, and manually program the application to provide the haptic outputs in response to the identified user inputs or in combination with the identified visual or audio outputs. As will be appreciated, this manual programming is a time-consuming process at the programming stage. Alternatively, some simple processing, for example filtering or rectifying, may be applied to the audio signal, and this processed signal may be used to drive the haptic transducer. However, this approach has the disadvantage in that the haptic output mirrors the amplitude of the audio output, and the desired effect of having the haptic response only highlight, or emphasise certain events is lost. Furthermore, having the haptic circuit continuously active is detrimental to battery life in mobile devices.

It may therefore be desirable to be able to selectively scan the audio signal for relevant events and to derive a suitable haptic output. In some applications, such as for example gaming applications, the user-experience for events such as on-screen gunshots, or for example, other "loud" virtual events, or events with specific characteristics, may be enhanced by a haptic response. These events may therefore be considered as a "haptic trigger". A haptic trigger may therefore in some examples, be characterized by a part of the audio signal at which a large energy change occurs, or a high rate-of change of the energy occurs.

Figure 2:
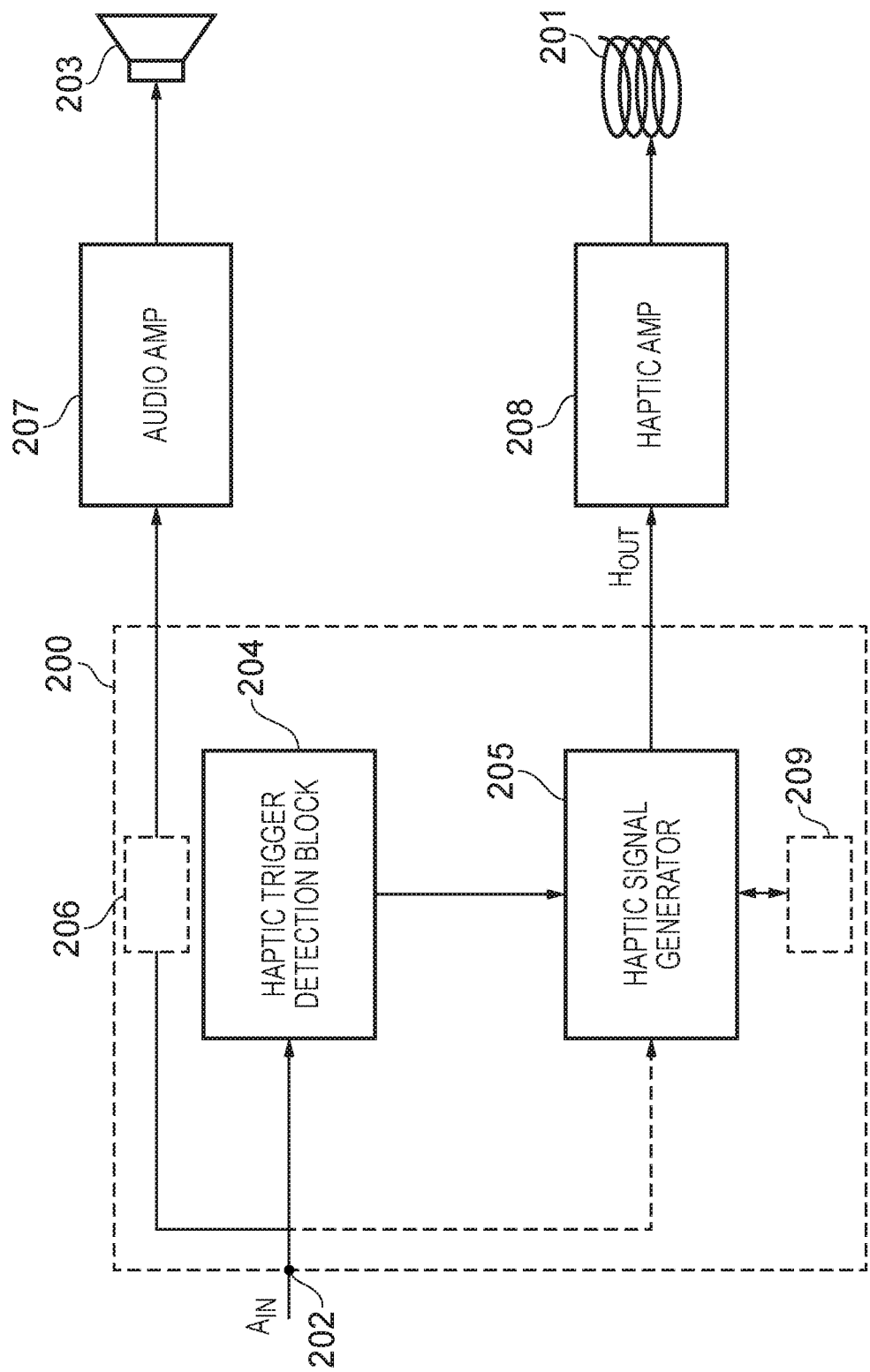
FIG. 2 illustrates an example of a processor for triggering a haptic signal $H_{OUT}$ being output to a haptic transducer in accordance with some embodiments.

FIG. 2 illustrates a processor 200 for triggering a haptic signal $H_{OUT}$ being output to a haptic transducer 201 according to some embodiments. In some examples, the haptic signal $H_{OUT}$ may be amplified by a haptic amplifier 208 before being driven to the haptic transducer 201.

The processor 200 comprises an input 202 for receiving an audio signal $A_{IN}$ for output through an audio output transducer 203. The audio signal $A_{IN}$ may be amplified by an audio amplifier 207 before being driven through the audio output transducer 203. The output transducer 203 may be part of the same device as the processor 200, or may be an external transducer on a separate device, for example, a speaker or headphone. The device comprising the processor 200 may therefore comprise an output suitable for connection to such an external transducer.

The processor 200 further comprises a haptic trigger detection block 204. The haptic trigger detection block 204 is configured to receive the audio signal $A_{IN}$ and to determine whether the audio signal $A_{IN}$ comprises a haptic trigger based on an indication of a rate of change of an amplitude of the audio signal $A_{IN}$. A haptic trigger may be considered a part of the audio signal which has a certain characteristic indicating that it is suitable for output in conjunction with a haptic signal.

For example, if the rate of change of the amplitude of the audio signal is above a first threshold value, such rate of change may indicate that an audio event is occurring in the audio signal $A_{IN}$ that may warrant a haptic event in order to highlight or emphasize the audio event to the user.

The haptic trigger detection block 204 may then indicate to a haptic signal generator 205 whether or not the audio signal $A_{IN}$ comprises a haptic trigger. The haptic signal generator 205, responsive to receiving the indication that the audio signal comprises a haptic trigger, may trigger the haptic signal $H_{OUT}$ to be output to the haptic transducer 201.

In some examples, the indication comprises an indication of the type of audio event occurring, for example, the indication may comprise information indicating that the audio signal comprises a gunshot. The haptic signal generator 205 may therefore generate an appropriate haptic signal $H_{OUT}$, for example by selecting predefined haptic signal from a memory 209, based on the indicated type of audio event causing the haptic trigger in the audio signal.

In some examples, the indication may indicate the rate of change of the amplitude of the audio signal $A_{IN}$. The haptic signal generator 205 may therefore generate an appropriate haptic signal $H_{OUT}$ based on the rate of change of the amplitude of the audio signal $A_{IN}$. For example, if the rate of change of the amplitude of the audio signal $A_{IN}$ is low, for example, below a second threshold value higher than the first threshold value, the haptic signal generator 205 may generate a haptic signal $H_{OUT}$ of a first type. For example, the first type of haptic signal may comprise buzzes or Piece Wise Linear Envelope (PWLE) type waveforms, which are examples of simple and efficient methods of storing a haptics waveform.

However, if the rate of change of the amplitude of the audio signal $A_{IN}$ is high, for example, above the second threshold value, the haptic signal generator 205 may generate a haptic signal $H_{OUT}$ of a second type. The second type of haptic signal $H_{OUT}$ may comprise waveforms which are shorter and more impulsive than the first type of haptic signal. For example, a haptic signal of the second type may comprise a 'more aggressive' or 'click' style waveform, stored in the device (or memory) as a wave file consisting of discrete sampled data.

In some examples, the indication may comprise the audio signal $A_{IN}$ itself. In other words, the haptic trigger detection block 204 may, responsive to detecting that the audio signal comprises a haptic trigger, output the audio signal $A_{IN}$ to the haptic signal generator. In this example, the haptic signal generator may generate the haptic signal by processing the audio signal $A_{IN}$ comprising the haptic trigger. The processing applied may be as described later with reference to FIG. 6.

In other examples, the haptic signal generator 205 may receive the audio signal $A_{IN}$ as an input separately to the indication. In this example, the indication may flag to the haptic signal generator 205 when the audio signal $A_{IN}$ comprises a haptic trigger, and therefore when to generate a haptic signal $H_{OUT}$ from the audio signal $A_{IN}$.

In some examples, particularly those in which the haptic signal $H_{OUT}$ is generated from the audio signal $A_{IN}$, the audio signal $A_{IN}$ may be delayed by delay block 206 before being output to the audio amplifier 207. In particular, the delay block 206 may be configured to introduce the same delay into the path between the input 202 and the audio amplifier 207 as there will be introduced by the processing in the haptic signal generator 205 between the input 202 and the haptic amplifier 208.

Figure 3:
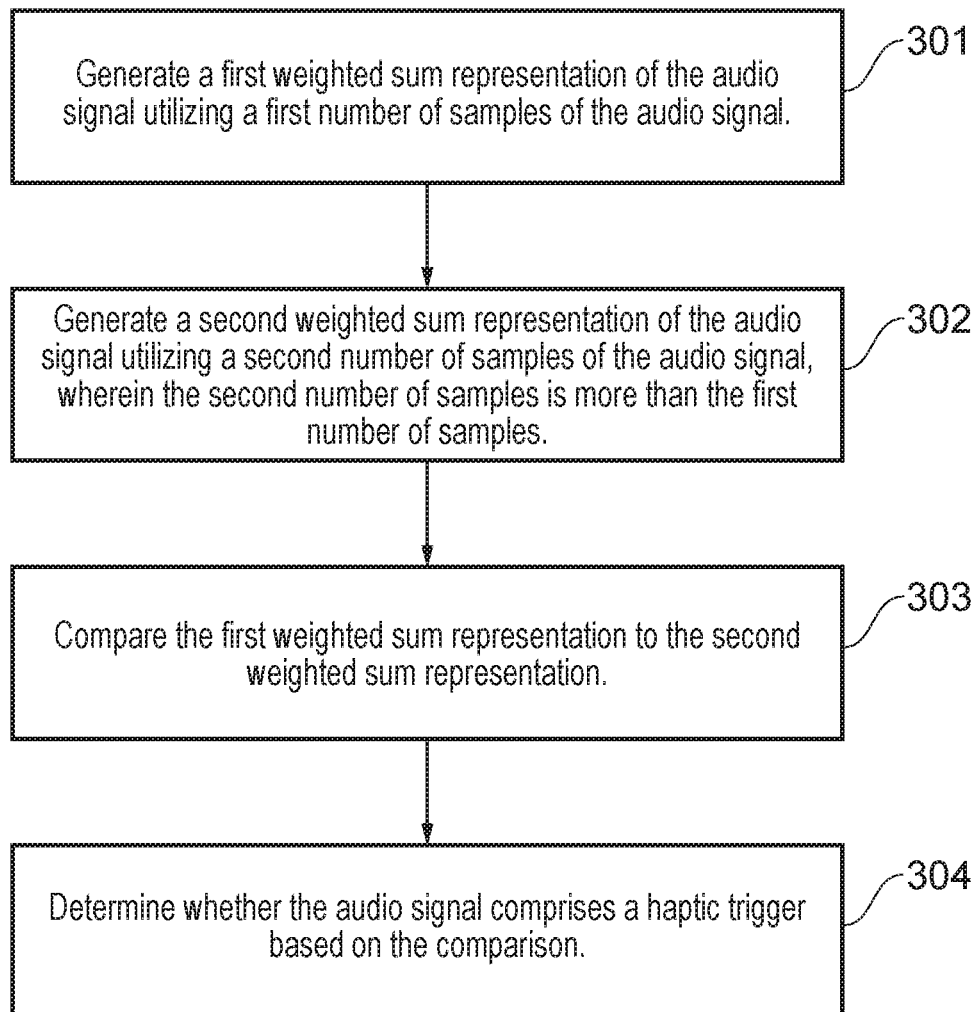
FIG. 3 is an example flow chart illustrating a method for determining whether the audio signal comprises a haptic trigger in accordance with some embodiments.
Figure 4A:
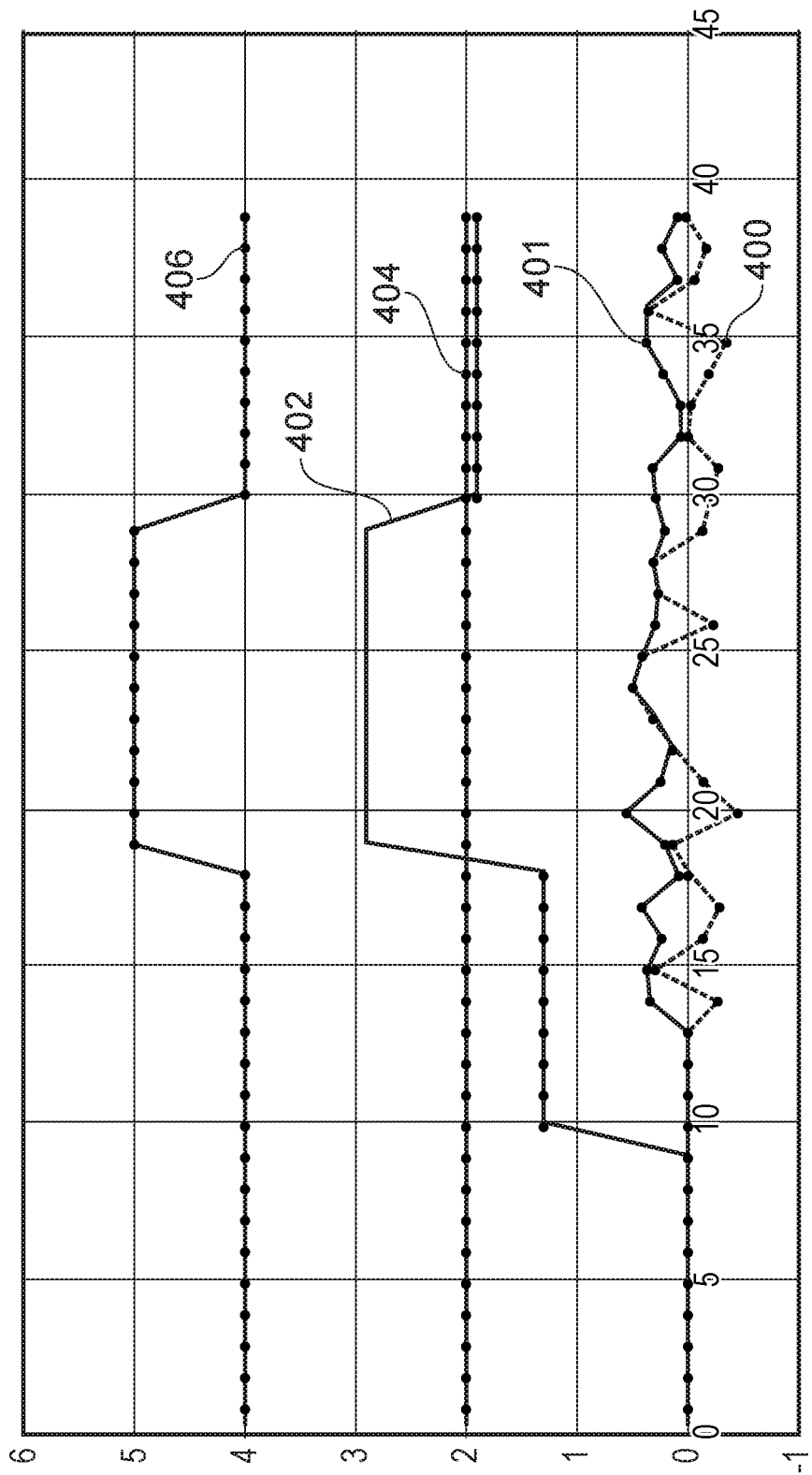
FIG. 4a illustrates an example audio signal, a first weighted sum representation of the audio signal and a second weighted sum representation of the audio signal.

FIG. 3 illustrates a method for determining whether the audio signal comprises a haptic trigger according to some embodiments. The method illustrated in FIG. 3 may, for example, be performed by the haptic trigger detection block 204 illustrated in FIG. 2. To illustrate an example of this method, an example audio signal 400 of FIG. 4a is referenced.

In step 301, the haptic trigger detection block 204 generates a first weighted sum representation 402 of a rectified version 401 of the audio signal 400 utilizing a first number of samples of the rectified version 401 of the audio signal 400. The first weighted sum representation 402 provides a rolling representation of the energy in the rectified version 401 of the audio signal 400.

In step 302, the haptic trigger detection block 204 generates a second weighted sum representation 404 of the rectified version 401 of the audio signal 400 utilizing a second number of samples of the rectified version 401 of the audio signal 400, wherein the second number of samples is more than the first number of samples used in step 301.

When more samples are used to generate a weighted sum representation of a signal, the representation is less reactive to the presence of peaks and troughs in the audio signal. The second weighted sum representation 404 is therefore less reactive to the peaks and troughs in the rectified version 401 of the audio signal 400 than the first weighted sum representation 402.

In step 303, the haptic trigger detection block 204 may compare the first weighted sum representation 402 to the second weighted sum representation 404. This comparison may be an indication of the rate of change of the amplitude of the audio signal 400.

In step 304, the haptic trigger detection block 204 may determine whether the audio signal 400 comprises a haptic trigger based on the comparison made in step 303.

For example, the haptic trigger detection block 204 may determine that the audio signal 400 comprises a haptic trigger when the first weighted sum representation 402 exceeds the second weighted sum representation 404, as illustrated by the flag 406 in FIG. 4a.

In some examples, the haptic trigger detection block 204 may determine that the audio signal comprises a haptic trigger when the first weighted sum representation 402 exceeds the second weighted sum representation 404 plus a predetermined offset.

It will be appreciated that the processor during some applications may adjust the sensitivity of the haptic output. For example, during some applications, the processor 200 may adjust a first set of weighting coefficients (which may comprise one or more coefficients) used to generate the first weighted sum representation and/or adjusting a second set of weighting coefficients (which may comprise one or more coefficients) used to generate the second weighted sum representation, based on a desired haptic trigger characteristic. In other words, the weighted sums may be altered such that the rate of change of the amplitude of the audio signal is required to be higher or lower to cause a haptic trigger.

The adjusting of the first or second weighting coefficient may also adjust the frequency response contained within the respective weighted sum representation. For example, the second weighted sum may be configured to filter out high frequencies more than the first weighted sum; or to create a high pass filter effect so the second weighted sum ignores any bass content. In this way, the comparison of the weighted sums may search for haptic triggers in desired frequency ranges.

In some examples, the haptic trigger detection block may determine that the audio signal no longer comprises a haptic trigger based on the indication of the rate of change of the amplitude of the audio signal. In some examples, the comparison between the first weighted sum representation 402 and the second weighted sum representation 404 may determine the length of the haptic signal or the amplitude of the haptic signal. For example, when the difference between the first weighted sum representation 402 and the second weighted sum representation 404 is greater, the haptic signal is longer or the amplitude of the haptic signal is higher.

Responsive to determining that the audio signal no longer comprises a haptic trigger, the haptic trigger detection block may indicate this condition to the haptic signal generator 205.

In some examples, the haptic trigger detection block may determine that the audio signal no longer comprises a haptic trigger when the first weighted sum representation 402 falls back below the second weighted sum representation 404.

In some examples, the haptic trigger detection block 204 may determine that the audio signal no longer comprises a haptic trigger when the first weighted sum representation 402 falls below the second weighted sum representation 404 by a predetermined offset. In this example, some hysteresis may be used.

It will be appreciated that in some examples, multiple different weighted sum representations and associated offsets may be used to detect different types of haptic trigger corresponding to different types of audio events. Haptic signals may then be generated depending on which type of haptic trigger is present.

In order to trigger a haptic signal being output to a haptic transducer such that the haptic signal is synchronised with the audio signal comprising the haptic trigger, the processing used to generate the haptic signal may have a time limitation. This factor effectively may limit the functionality and range of decision points available to register haptic triggers based on changes in energy level in the audio signal.

Figure 4B:
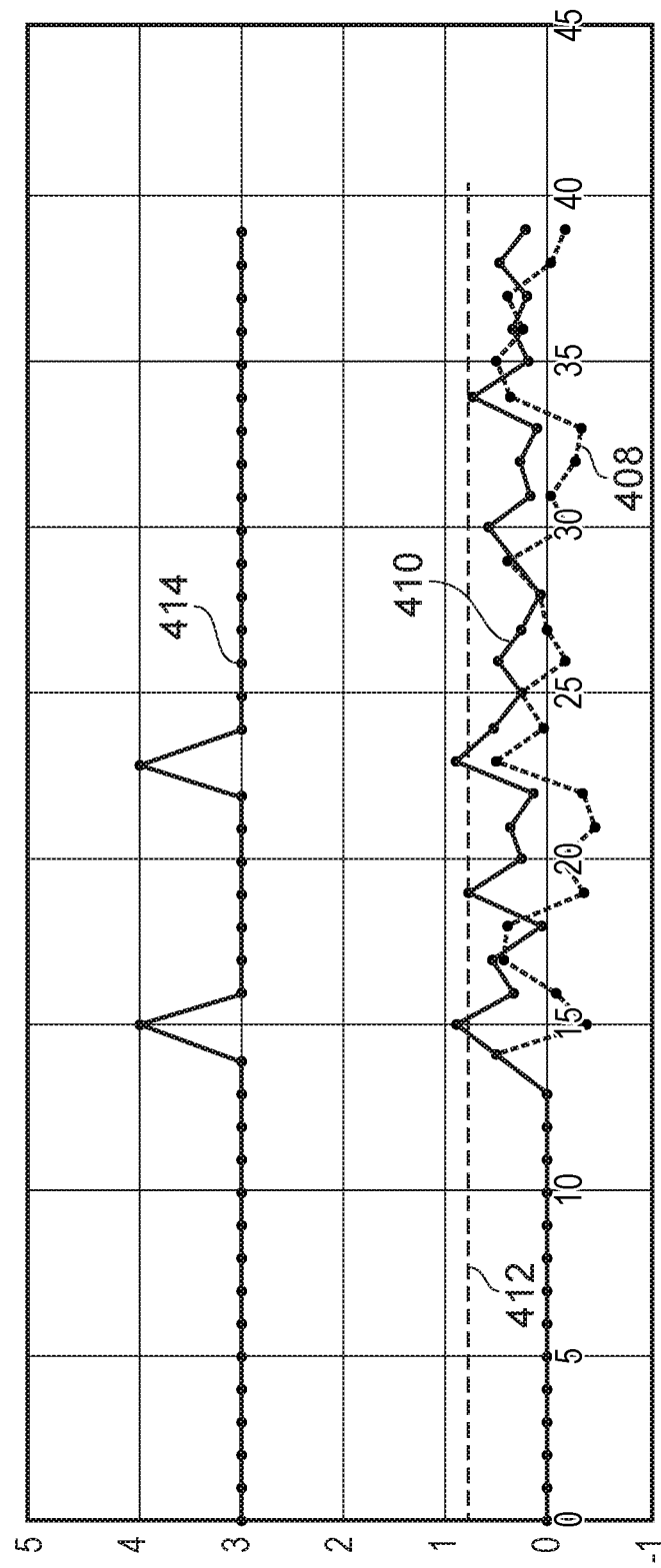
FIG. 4b illustrates an example audio signal and a rate of change of the audio signal.

FIG. 4b illustrates an example in which the rate of change of the audio signal is used for determining whether the audio signal comprises a haptic trigger according to some embodiments.

In this example, an audio signal 408 and the rate of change of that audio signal 410 are illustrated. The haptic trigger may be detected when the rate of change of the audio signal 410 is above a predetermined threshold value 412. Such detection is illustrated by the flag 414.

Figure 5:
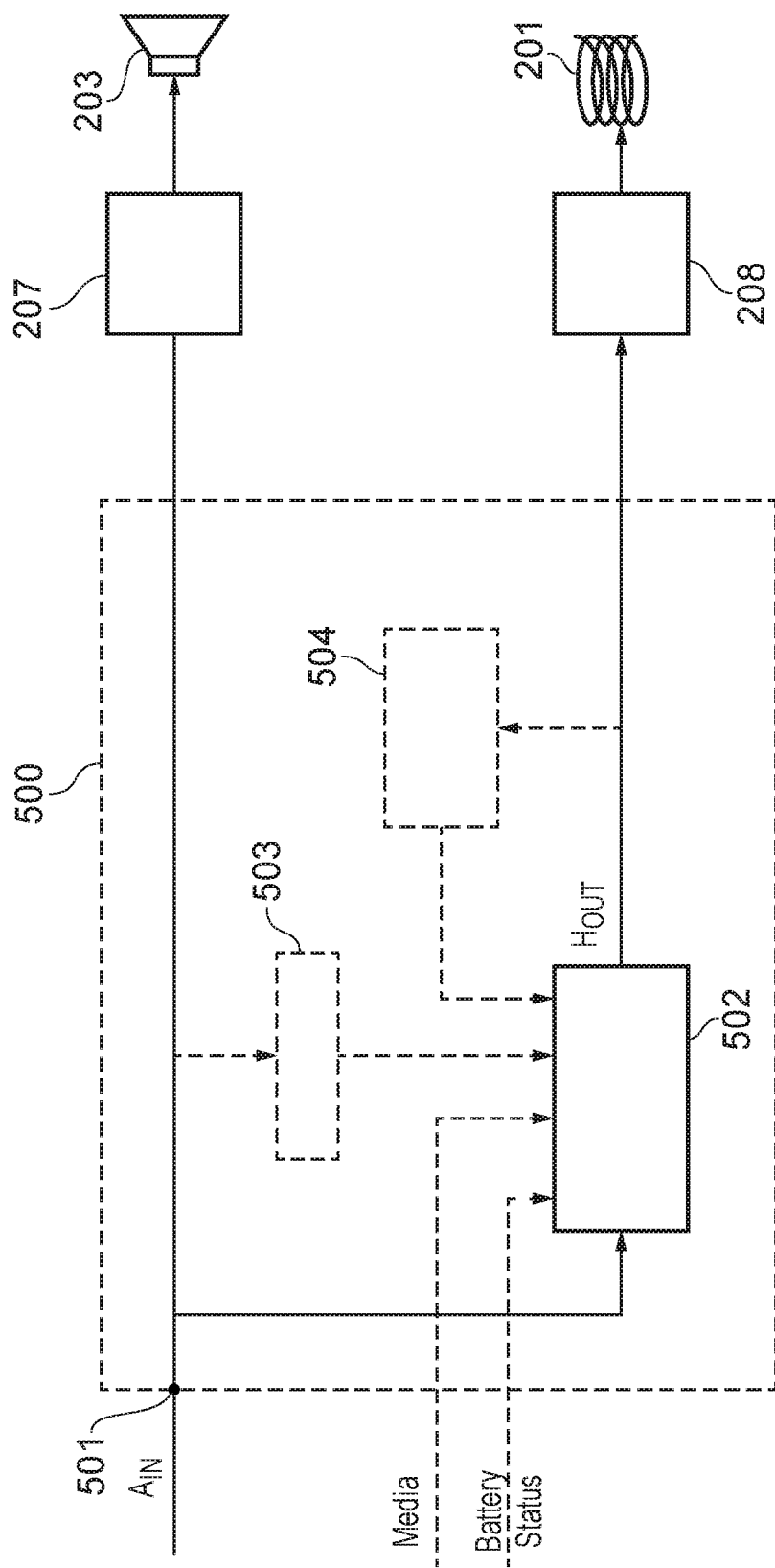
FIG. 5 illustrates an example of a processor for triggering a haptic signal being output to a haptic transducer in a device in accordance with some embodiments.

FIG. 5 illustrates a processor 500 for triggering a haptic signal $H_{OUT}$ being output to a haptic transducer 201 in a device according to some embodiments. Similar features to those illustrated in FIG. 2 have been given the same reference numbers. In some examples, the haptic signal $H_{OUT}$ may be amplified by a haptic amplifier 208 before being driven through the haptic transducer 201.

The processor 500 comprises an input 501 for receiving an audio signal $A_{IN}$ for output through an audio output transducer 203. The audio signal $A_{IN}$ may be amplified by an audio amplifier 207 before being driven through the audio output transducer 203.

The processor 500 comprises a haptic signal determination block 502. The haptic signal determination block may be configured to determine, based on the audio signal and at least one criteria, a haptic signal for outputting to the transducer. In some examples, the haptic signal determination block 502 comprises a haptic trigger detection block 204 and a haptic signal generator 205 as illustrated in FIG. 2. In these examples, responsive to the audio signal meeting a first criteria of the at least one criteria, a determination is made that the audio signal comprises a haptic trigger, and responsive to determining that the audio signal comprises the haptic trigger, the haptic signal is output to the transducer. As described with reference to FIG. 2, the first criteria may therefore comprise the threshold rate of change of the amplitude of the audio signal, which may be represented by the comparison between the first weighted sum representation of the audio signal and the second weighted sum representation of the audio signal.

In this example, the at least one criteria may comprise a second criteria. For example, the second criteria may comprise the second threshold value as described above. In other words, if the rate of change of the amplitude of the audio signal $A_{IN}$ is high, for example, above the second threshold value, the haptic signal generator 205 may generate a haptic signal $H_{OUT}$ of a second type. The second type of haptic signal $H_{OUT}$ may comprise waveforms which are shorter and more impulsive than the first type of haptic signal. For example, a haptic signal of the second type may comprise a click waveform. Alternatively, the second criteria may comprise a relationship between the value of the rate of change of the amplitude of the audio signal and the amplitude of the determined haptic signal. In other words, in some examples, when the rate of change is higher, the amplitude of the generated haptic signal is higher.

In some examples, the haptic signal may be generated from the haptic trigger by the haptic signal determination block 502 based on a third criteria of the at least one criteria. For example, the third criteria may comprise one or more of the following: a maximum amplitude for the haptic signal, an allowed dynamic range for the haptic signal, and an allowed frequency range for the haptic signal. The haptic signal may therefore be generated from the audio signal such that it meets the third criteria.

It will be appreciated that other methods may be utilized to generate a haptic signal from an audio signal which may use different criteria to determine whether a haptic signal will be output and what the haptic signal will be. However, the embodiment illustrated in FIG. 2 may be considered to be a fast reacting decision stage, which may therefore provide a haptic signal quickly, thereby maintaining synchronization with the audio signal.

The processor 500 may then be configured to dynamically adjust the at least one criteria based on a parameter, wherein the parameter comprises one or more of the following: information relating to the content of media playback for playback in conjunction with the audio signal, information relating to the content of the audio signal, information relating to historical haptic events associated with the audio signal, and a battery charge status of the device. This processing to determine the dynamic adjustment of the criteria based on the parameter may therefore take place over a longer time period than the determination of the haptic signal, leading to more flexibility in the types of information that may be utilized to determine the haptic signal.

In other words, the haptic signal determination block 502 may comprise processing which is of a lower latency than the processing required to dynamically adjust the at least one criteria. This higher latency processing may therefore be used to: a) apply more processing power to the determination of the haptic signal and b) employ algorithms and techniques which are more suited to larger audio data sets. By adjusting the at least one criteria, the higher latency processing may effectively train or adapt the lower latency processing without affecting the latency of the output haptic signal.

The criteria described above may be adjusted by the processor in order to reduce a repetition rate of haptic signal events derived from the audio signal. For example, in some scenarios, the parameter may indicate that the repetition rate of haptic signal events occurring is too high (for example the user may have indicated by user input that the haptic events are too frequent) and should be reduced for a future repetition rate.

For example, where the parameter comprises a threshold rate of change for the amplitude of the audio signal, the adjustment may comprise adjusting the number of samples used for the first weighted sum and/or second weighted sum representation of the audio signal. Alternatively, the adjustment may comprise increasing or decreasing the offset to reduce or increase the frequency of the detection of haptic triggers.

In some examples, the processor comprises a speech detection block 503 configured to determine whether or not the audio signal comprises speech. The parameter may therefore comprise information relating to the content of the audio signal which indicates whether or not the audio signal comprises speech. It will be appreciated that in some examples, an indication of whether or not the audio signal comprises speech may be received by the processor 500 from an external processor.

In these examples, the processor may be configured to adjust the at least one criteria to reduce the repetition rate of haptic signal events responsive to the parameter indicating that the audio signal comprises speech. This adjustment may be configured to prevent plosive constants such as "p" in speech in the audio signal from causing unwanted haptic responses. In some examples, at least one criteria may be adjusted to turn off the generation of any haptic signal responsive to speech being indicated by the parameter.

In some examples, the parameter comprises a battery charge status of the device. In these examples, the processor may adjust the at least one criteria to reduce the repetition rate of haptic signal events responsive to the parameter indicating that the battery status is below a threshold level. In other words, if the battery of the device is running low, the haptics response may be reduced in order to conserve battery power for applications which are considered more vital to the operation of the device. For example, responsive to the parameter indicated that the battery of the device is below a threshold level, the at least one criteria may be adjusted to decrease one or more of the following: the intensity, length or time density of haptic signals being output to the haptic transducer. This adjustment of the at least one criteria may therefore provide a more fine-tuned management of the trade-off between low battery scenarios and quality of user experience.

In some examples, the parameter comprises information relating to the content of media playback for playback in conjunction with the audio signal. For example, the audio signal may be played along with some video data, for example for a gaming application. In these examples, the processor may be configured to adjust the at least one criteria to select a haptic signal based on the content of the media playback, for example program content of the media playback. In other words, if the gaming content is for a military based game, the criteria may be adjusted to differentiate between gunshots represented by "on-screen" images (for example a muzzle flash) in the video data and "off-screen" gunshots not represented by images in the video data. The criteria utilized to generate the haptic signal may therefore be adjusted to produce different haptic signals for these two scenarios, even though the haptic trigger in the two scenarios may be very similar.

In some examples, the parameter comprises information relating to historical haptic events associated with the audio signal. For example, a haptics history block 504 may store data history relating to the haptic signals output during a particular audio stream. The haptics history block 504 may comprise processing that is configured, for example, to look for repeated haptic signals output during the audio signal. The haptics history block 504 may then output a parameter to adjust the at least one criteria to optimize any expected future output of the repeated haptic signal.

In some examples, time synchronization of the audio signal $A_{IN}$ with some other media content, for example video data, may be desired. With the addition of the haptic signal derived from the audio signal, a third synchronization variable may need to be controlled. The haptic signal may be delayed, even slightly, with respect to the incoming audio to the system. However, if the audio signal is able to be arranged to arrive at the processor in advance of the other media content, the output audio and haptic signals from the processor may be aligned with the other media content.

Figure 6:
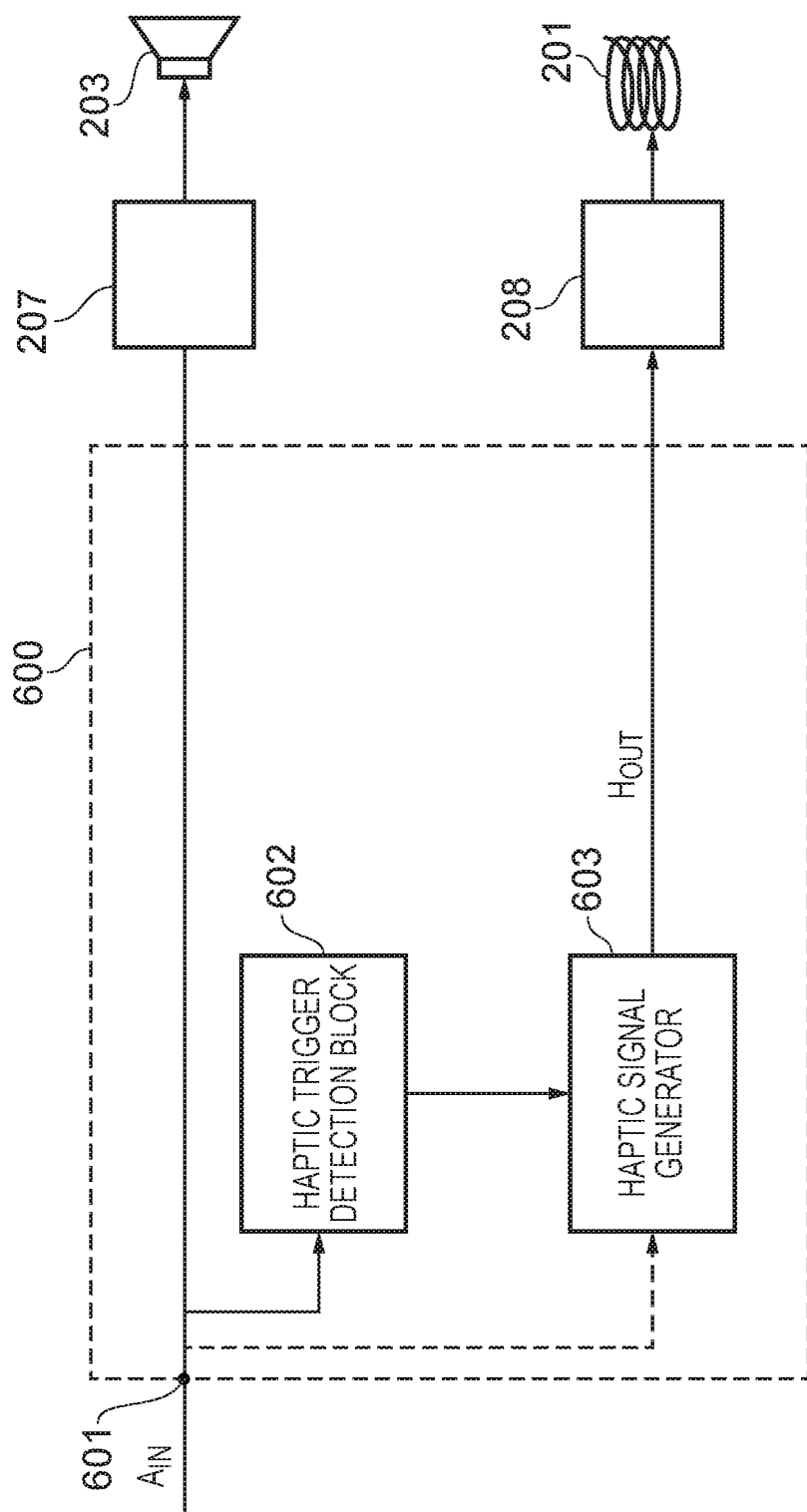
FIG. 6 illustrates an example of a processor comprising an audio output transducer and a haptic transducer, wherein the processor outputs a haptic signal to the haptic transducer in accordance with some embodiments.

FIG. 6 illustrates a processor 600 comprising an audio output transducer 203 and a haptic transducer 201, wherein the processor 600 outputs a haptic signal $H_{OUT}$ to the haptic transducer 201. Similar features to those illustrated in FIG. 2 have been given the same reference numbers. In some examples, the haptic signal $H_{OUT}$ may be amplified by a haptic amplifier 208 before being driven through the haptic transducer 201.

The processor 600 comprises an input 601 configured to receive an audio signal for output through an audio output transducer 203, for example a speaker.

The processor 600 comprises a haptic trigger detection block 602 configured to determine whether the audio signal comprises a haptic trigger. The haptic trigger detection block 602 may be configured similarly to the haptic trigger detection block 204 in FIG. 2. Alternatively, other methods of detecting haptic triggers in an audio signal may be performed by the haptic trigger detection block 602.

The haptic trigger detection block 204 may then indicate to a haptic signal generator 205 whether or not the audio signal $A_{IN}$ comprises a haptic trigger. In some embodiments, the indication comprises the haptic trigger of the audio signal $A_{IN}$. In other words, the haptic trigger detection block 204 may output the audio signal comprising the haptic trigger to the haptic signal generator 205. In some embodiments, the haptic signal generator comprises an input for receiving the audio signal $A_{IN}$ and the indication comprises information indicating the location of the haptic trigger within the audio signal.

The haptic signal generator 205, responsive to receiving the indication that the audio signal $A_{IN}$ comprises a haptic trigger, maps energy in the received haptic trigger (either received from the haptic trigger detection block, or received as part of the audio signal) at frequencies outside of an intended frequency range to frequencies within the intended frequency range to generate the haptic signal. In particular, the haptic signal generator maps the frequencies by undersampling data in the audio signal comprising the haptic trigger, such that the energy in the haptic trigger at frequencies above the intended frequency range is shifted into frequencies within the intended frequency range to generate the haptic signal.

The intended frequency range may comprise frequencies that, when input into the haptic transducer 201, result in a haptic event that may be felt by a user. The mapping of the higher frequencies by undersampling the haptic trigger means that the energy in the haptic trigger may be felt by the user in a haptic event resulting from the haptic signal. By undersampling data in the audio signal comprising the haptic trigger, the haptic signal generator may therefore create a haptic signal which is representative of the audio signal comprising the haptic trigger but that is within a frequency range that is suitable for reproduction through a haptic transducer 201.

The haptic signal generator 205 may be configured to output the haptic signal to the haptic transducer.

In some examples, the haptic signal generator may be configured to adjust the dynamic range of the haptic trigger to generate the haptic signal. In other words, while a typical 16 bit audio signal may have a dynamic range that reaches and goes beyond 90 dB, the resolving sensitivity of a user to the haptic event resulting from a haptic signal is much less, for example 20 to 30 dB. Subsequently, if low level audio material is found to form part of the audio signal during a haptic trigger, the dynamic range of the haptic trigger may be adjusted to suit the sensitivity of a user to the resulting haptic event.

In some examples, the haptic signal generator may be further configured to distort the audio signal energy at frequencies below the intended frequency range in the haptic trigger, such that corresponding energy is created within the intended frequency range in the haptic signal. Similarly, low frequency content below the intended frequency range may not be felt by a user. The haptic signal generator may therefore rectify or otherwise distort the low frequencies of the haptic trigger to intentionally create high level harmonics within the intended frequency band, so that the haptic event may be felt by the user.

It will be appreciated that the processors 200, 500 and 600 may be implemented as the at least part of the signal processor 108 in a device such as the device 100 illustrated in FIG. 1.

Figure 7:
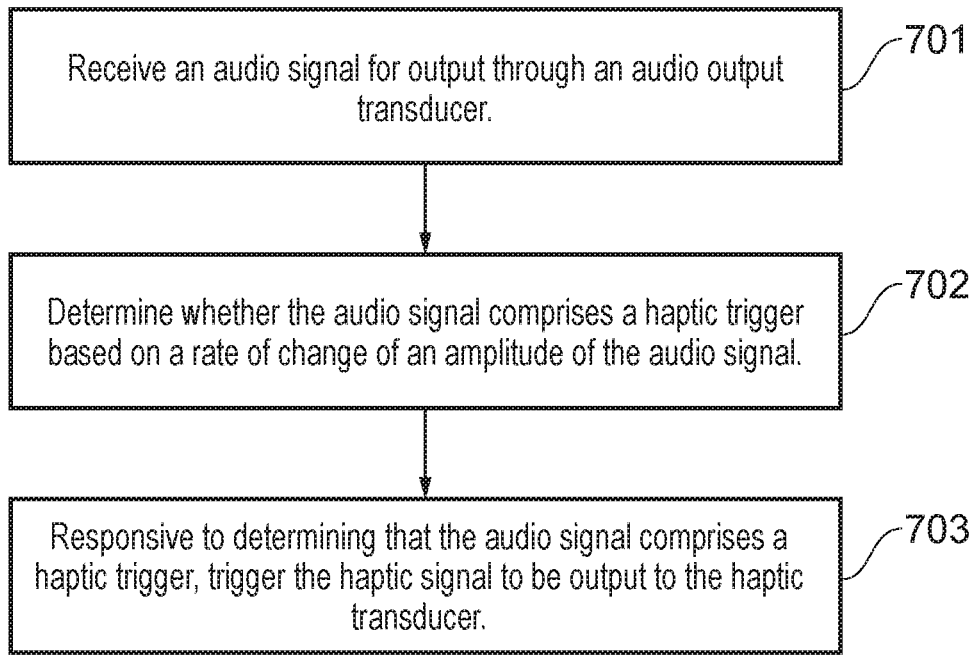
FIG. 7 is an example flow chart illustrating a method for triggering a haptic signal being output to a haptic transducer in accordance with some embodiments.

FIG. 7 illustrates a method for triggering a haptic signal being output to a haptic transducer. The method may be performed by a processor, for example the processor 200 in FIG. 2, or any suitable circuitry.

In step 701, the method comprises receiving an audio signal for output through an audio output transducer.

In step 702, the method comprises determining whether the audio signal comprises a haptic trigger based on an indication of rate of change of an amplitude of the audio signal.

In step 703, the method comprises responsive to the determining that the audio signal comprises a haptic trigger, triggering the haptic signal to be output to the haptic transducer.

Figure 8:
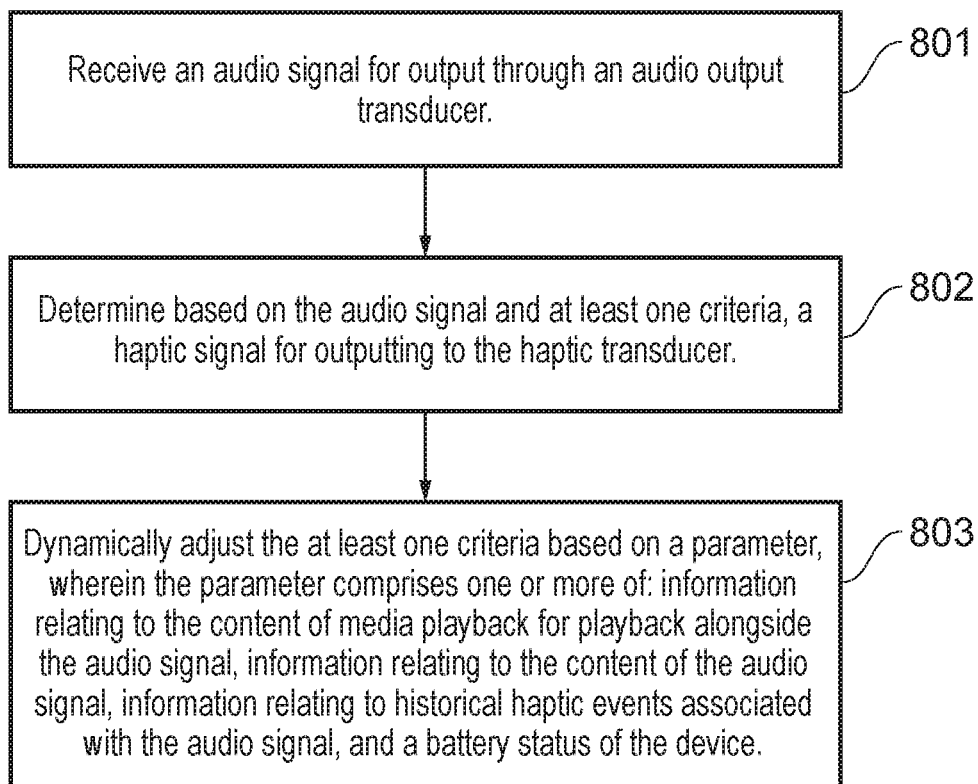
FIG. 8 is an example flow chart illustrating a method for outputting a first haptic signal to a haptic transducer in a device in accordance with some embodiments.

FIG. 8 illustrates a method, for outputting a first haptic signal to a haptic transducer in a device. The method may be performed by a processor, for example the processor 500 in FIG. 5, or any suitable circuitry.

In step 801, the method comprises receiving an audio signal for output through an audio output transducer.

In step 802, the method comprises determining, based on the audio signal and at least one criteria, a haptic signal for outputting to the haptic transducer.

In step 803, the method comprises dynamically adjusting the at least one criteria based on a parameter, wherein the parameter comprises one or more of the following: information relating to the content of media playback for playback in conjunction with the audio signal, information relating to the content of the audio signal, information relating to historical haptic events associated with the audio signal, and a battery charge status of the device.

Figure 9:
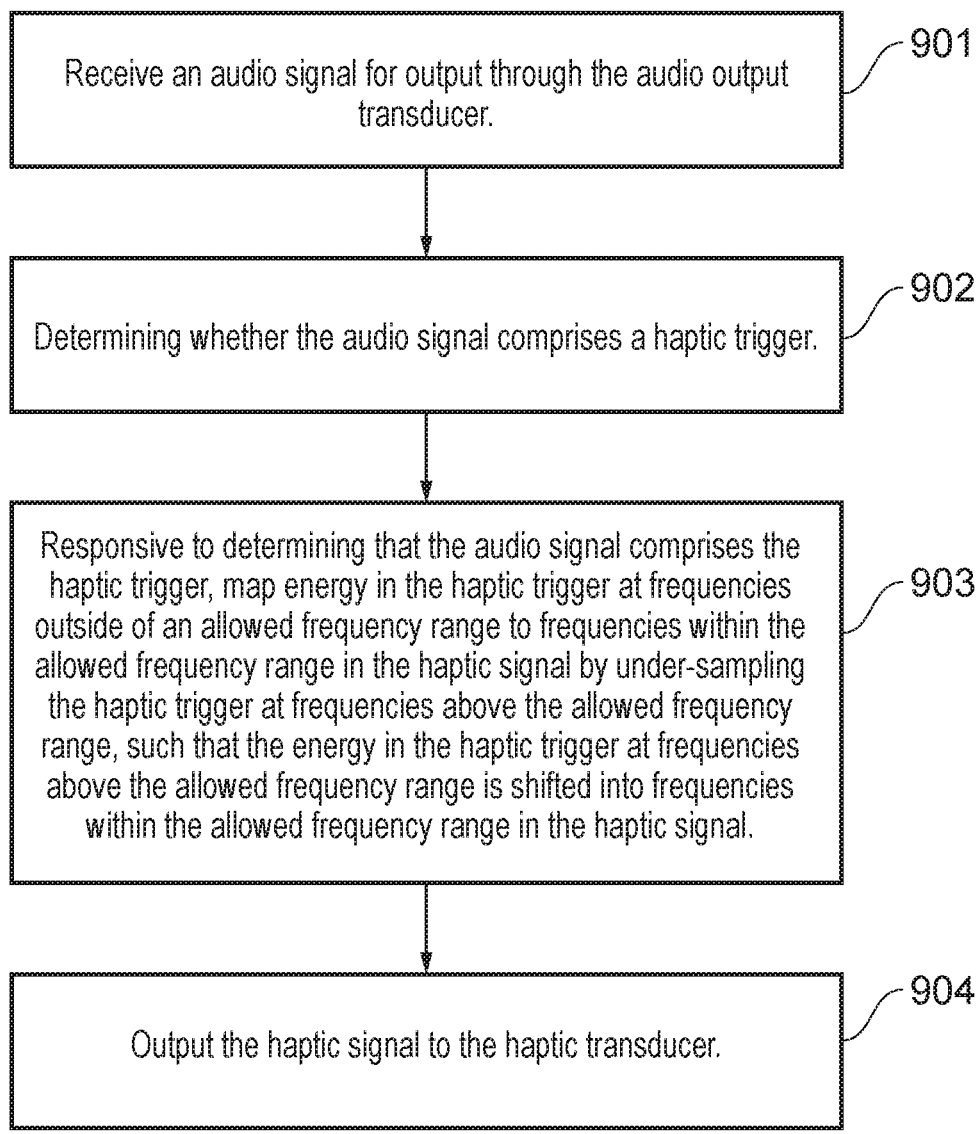
FIG. 9 is an example flow chart illustrating a method for outputting a haptic signal to a haptic transducer in accordance with some embodiments.

FIG. 9 illustrates a method, for generating a haptic signal for output to a haptic transducer. The method may be performed by a processor, for example the processor 600 in FIG. 6, or any suitable circuitry.

In step 901, the method comprises receiving an audio signal for output through the audio output transducer.

In step 902, the method comprises determining whether the audio signal comprises a haptic trigger.

In step 903, the method comprises responsive to determining that the audio signal comprises the haptic trigger, mapping energy in the haptic trigger at frequencies outside of an intended frequency range to frequencies within the intended frequency range in the haptic signal by undersampling data in the audio signal comprising the haptic trigger such that the energy in the haptic trigger at frequencies above the intended frequency range is shifted into frequencies within the intended frequency range in the haptic signal. There is therefore provided methods and apparatus for outputting a haptic signal to a haptic transducer based on a received audio signal for output through a speaker.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfil the functions of several units recited in the claims. Any reference numerals or labels in the claims shall not be construed so as to limit their scope.

Terms such as amplify or gain include possible applying a scaling factor or less than unity to a signal.

It will of course be appreciated that various embodiments of the analog conditioning circuit as described above or various blocks or parts thereof may be co-integrated with other blocks or parts thereof or with other functions of a host device on an integrated circuit such as a Smart Codec.

The skilled person will thus recognize that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise hardware code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure makes reference to specific embodiments, certain modifications and changes can be made to those embodiments without departing from the scope and coverage of this disclosure. Moreover, any benefits, advantages, or solution to problems that are described herein with regard to specific embodiments are not intended to be construed as a critical, required, or essential feature of element.

Further embodiments likewise, with the benefit of this disclosure, will be apparent to those having ordinary skill in the art, and such embodiments should be deemed as being encompasses herein.

The invention claimed is:

1. A method for triggering a haptic signal being output to a haptic transducer comprising:
    receiving, by a processor, an audio signal for output through an audio output transducer;
    determining, by the processor, whether the audio signal comprises a haptic trigger based on an indication of a rate of change of an amplitude of the audio signal, wherein the step of determining comprises:
        generating a first weighted sum representation of the audio signal utilizing a first number of samples of a rectified version of the audio signal;
        generating a second weighted sum representation of the audio signal utilizing a second number of samples of the rectified version of the audio signal, wherein the second number of samples is more than the first number of samples; and
        comparing the first weighted sum representation to the second weighted sum representation to determine the indication of the rate of change of the amplitude of the audio signal; and
    responsive to determining that the audio signal comprises the haptic trigger, triggering, by the processor, the haptic signal to be output to the haptic transducer.

2. The method of claim 1 wherein the step of comparing comprises:
    determining that the audio signal comprises the haptic trigger when the first weighted sum representation exceeds the second weighted sum representation.

3. The method of claim 1 wherein the step of comparing comprises:
    determining that the audio signal comprises the haptic trigger when the first weighted sum representation exceeds the second weighted sum representation plus a predetermined offset.

4. The method of claim 1 further comprising one or more of the following steps:
    adjusting, by the processor, a first set of weighting coefficients used to generate the first weighted sum representation, and
    adjusting, by the processor, a second set of weighting coefficient used to generate the second weighted sum representation, based on a desired haptic trigger characteristic.

5. The method of claim 1 further comprising one or more of the following steps:
    adjusting, by the processor, the first number of samples based on a desired haptic trigger characteristic; and
    adjusting, by the processor, the second number of samples based on the desired haptic trigger characteristic.

6. The method of claim 1 further comprising:
    determining that the audio signal comprises the haptic trigger if the rate of change of the amplitude of the audio signal exceeds a threshold value.

7. A processor for triggering a haptic signal being output to a haptic transducer, comprising:
    an input to receive an audio signal for output through an audio output transducer;
    a haptic trigger detection block to determine whether the audio signal comprises a haptic trigger based on an indication of a rate of change of an amplitude of the audio signal, wherein the haptic trigger detection block determines whether the audio signal comprises the haptic trigger by:
        generating a first weighted sum representation of the audio signal utilizing a first number of samples of a rectified version of the audio signal;
        generating a second weighted sum representation of the audio signal utilizing a second number of samples of the rectified version of the audio signal, wherein the second number of samples is more than the first number of samples; and
        comparing the first weighted sum representation to the second weighted sum representation to determine the indication of the rate of change of the amplitude of the audio signal; and a haptic signal generator to trigger the haptic signal to be output to the haptic transducer, responsive to the determination that the audio signal comprises the haptic trigger.

8. The processor of claim 7 wherein the haptic trigger detection block determines that the audio signal comprises the haptic trigger when the first weighted sum representation exceeds the second weighted sum representation.

9. The processor of claim 7 wherein the haptic trigger detection block determines that the audio signal comprises the haptic trigger when the first weighted sum representation exceeds the second weighted sum representation plus a predetermined offset.

* * * * *